United States Patent [19]
Lou et al.

[11] Patent Number: 6,110,826
[45] Date of Patent: Aug. 29, 2000

[54] DUAL DAMASCENE PROCESS USING SELECTIVE W CVD

[75] Inventors: Chine-Gie Lou, Hsinchu; Hsueh-Chung Chen, Taipei, both of Taiwan

[73] Assignee: Industrial Technology Research Institute, Hsin-Chu, Taiwan

[21] Appl. No.: 09/092,816

[22] Filed: Jun. 8, 1998

[51] Int. Cl.[7] .................................................. H01L 21/44
[52] U.S. Cl. .......................... 438/674; 438/672; 438/706; 438/742; 257/762; 257/768; 257/769
[58] Field of Search ..................................... 438/624, 633, 438/634, 637, 638, 674, 672, 706, 742; 257/762, 768, 769

[56] References Cited

U.S. PATENT DOCUMENTS

| | | | |
|---|---|---|---|
| 5,462,890 | 10/1995 | Hwang et al. | 437/187 |
| 5,602,053 | 2/1997 | Zheng et al. | 437/60 |
| 5,614,765 | 3/1997 | Avanzino et al. | 257/774 |
| 5,661,080 | 8/1997 | Hwang et al. | 438/654 |
| 5,801,094 | 9/1998 | Yew et al. | 438/624 |
| 5,817,572 | 10/1998 | Chiang et al. | 438/624 |
| 5,897,369 | 4/1999 | Jun | 438/629 |
| 5,969,422 | 11/1999 | Ting et al. | 257/762 |
| 5,990,015 | 11/1999 | Lin et al. | 438/706 |
| 6,004,188 | 12/1999 | Roy | 451/41 |

OTHER PUBLICATIONS

S.Wolf, "Silicon Processing for the VLSI Era" vol. 2, Lattice Press, Sunset Beach, CA, 1990, p241.
Chang et al, "ULSI Technology", The McGraw Hill Companies, Inc, 1996, p444–5.

*Primary Examiner*—David Nelms
*Assistant Examiner*—Renee' R. Berry
*Attorney, Agent, or Firm*—George O. Saile; Stephen B. Ackerman

[57] ABSTRACT

A dual damascene process using selective tungsten chemical vapor deposition is provided for forming composite structures for local interconnects comprising line trenches with contact holes, and composite structures for intermetal interconnects comprising line trenches with via holes. It is shown that by forming a seed layer in judiciously selected portions of the dual damascene structure and depositing tungsten selectively in one step, contact holes and via holes can be formed free of voids and key-holes.

33 Claims, 4 Drawing Sheets

DUAL DAMASCENE PROCESS USING SELECTIVE W CVD

BACKGROUND OF THE INVENTION

(1) Field of the Invention

The present invention relates to the manufacture of ultra large scale integrated (ULSI) circuit chips in general, and in particular, to the filling of trench lines and via holes simultaneously in a dual damascene structure utilizing selective-W CVD process.

(2) Description of the Related Art

Dual damascene process is used more and more in the manufacturing of semiconductor devices because the process makes it possible to form interconnect lines and vias simultaneously, thus eliminating several conventional steps of forming them separately in a serial fashion. However, the characteristics of the vias and trench lines are usually degraded unless certain process steps are developed to take advantage of the damascene process while restoring the integrity of the integrated structure. The disclosed dual damascene process using selective-tungsten (W) chemical vapor deposited (CVD) tungsten (W) provides a relatively simple method of achieving the desired integrity for both the vias and the interconnect lines in a dual damascene structure.

The damascene process itself is a technique where metal interconnections are inlaid in performed grooves in a substrate, and is usually a preferred method of fabricating interconnections for integrated circuits. In contrast, the more conventional interconnections are formed by blanket depositing a conductive material on an insulation layer such as silicon oxide, and then etching the desired wiring pattern on the layer. The vertical connections between the wiring layers are made separately by forming holes in the insulation layers separating the metallized layers and then filling them with the same or a different conductive material.

Normally, a semiconductor substrate contains passive and active regions having active devices formed near the surface of the semiconductor substrate. The active devices are interconnected through an interlevel conductive layer. One or more metal wiring layers are then formed overlying the interlevel dielectric layer and are separated from each other by additional insulating layers. The wiring stripes are connected to each other and to the devices at the appropriate places by means of holes that are filled with metal through the insulating layers. The holes that connect the metal lines to each other through the insulating layer are called via holes, while the holes that reach the underlying devices through its insulating layer are called contact holes. Typically, the holes are etched into an insulating layer after the latter has been deposited on the semiconductor substrate on which the chips are fabricated. It is common practice to next blanket deposit metal on the insulating layer thereby filling the holes and then forming the metal lines by etching through a patterned photo resist mask formed on the metal layer. For the first metal layer, electrical contact is made with the underlying devices through contact holes, or windows, that allow the metal to descend through the dielectric insulator to the devices. For the second and subsequent wiring layers, the process is repeated and the contact between the metal layers is made through via holes that allow the metal to descend to the lower metal layer(s). It is also common practice to fill the holes separately with metal to form metal plugs first, planarize or smoothen them next with respect to the surface of the insulating layer and then deposit metal layer to make contact with the via plugs and then subtractively etch as before to form the required "personalized" wiring layer.

Figure 1A:
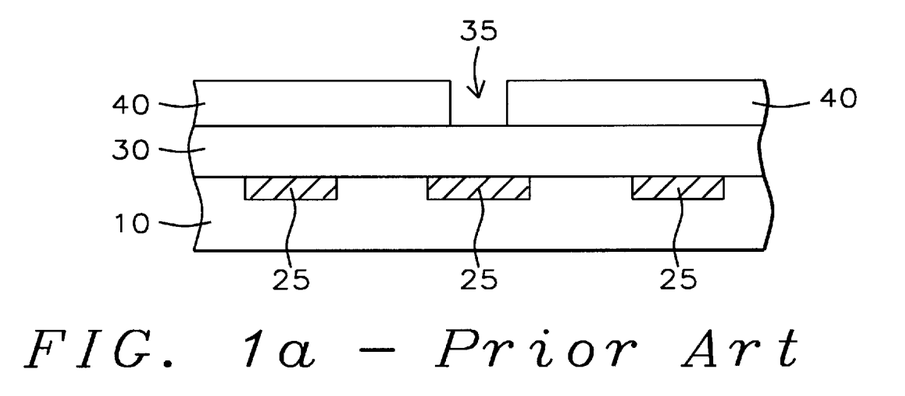
FIGS. 1a–1d show the forming of a dual damascene structure according to prior art.
Figure 1B:
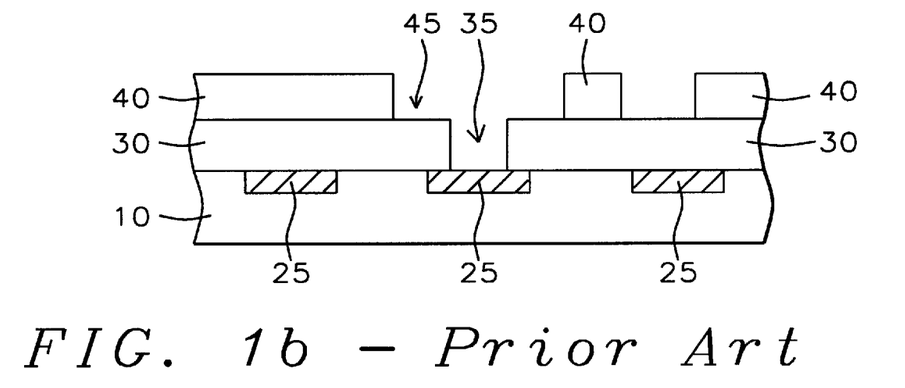

The more advanced process of forming interconnects with dual damascene is illustrated in FIGS. 1a–1d where, in addition to forming the grooves of single damascene, conductive via openings are also formed. In FIG. 1a of prior art, two layers of insulating layer, that is, lower layer (30) and upper layer, (40), are shown deposited on a first level interconnect metal layer (25) already formed on substrate (10). There is usually an etch stop layer between layers (30) and (40), depicted as reference to numeral (43).

Figure 1C:
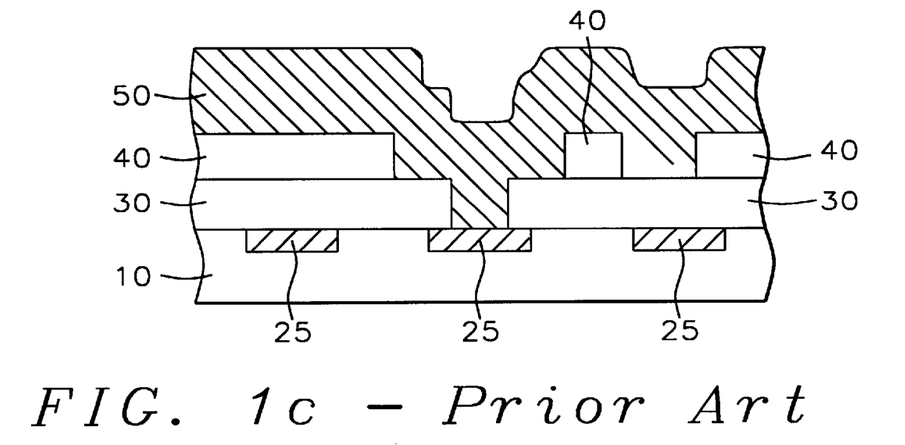
Figure 1D:
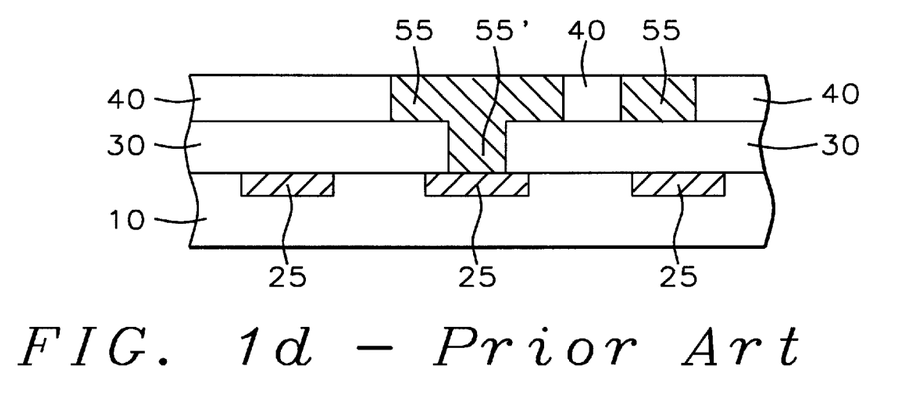

In this conventional dual damascene process, then, insulating layer (30) is coated with a photoresist (not shown) which is exposed through a first mask with image pattern of the via openings (35) and the pattern is anisotropically etched in upper insulating layer (40), that is, down to the etch stop layer. The photoresist now is exposed through a second mask with an image pattern of the conductive line openings, after being aligned with the first mask pattern to encompass the via openings. In anisotropically etching the opening for the conductive ones in the upper insulating layer, the via openings (35) already present in the upper insulating layer are simultaneously etched and replicated in the lower layer of insulating material (30). After the etching is complete, both the vias, (35), and line openings, or trenches, (45), are filled with metal (50) as shown in FIG. 1c. Finally, the substrate is subjected to chemical mechanical polishing until the underlying insulating material (40) is reached and the substrate surface, which is now inlaid with metal (55), is planarized for further processing.

Figure 2A:
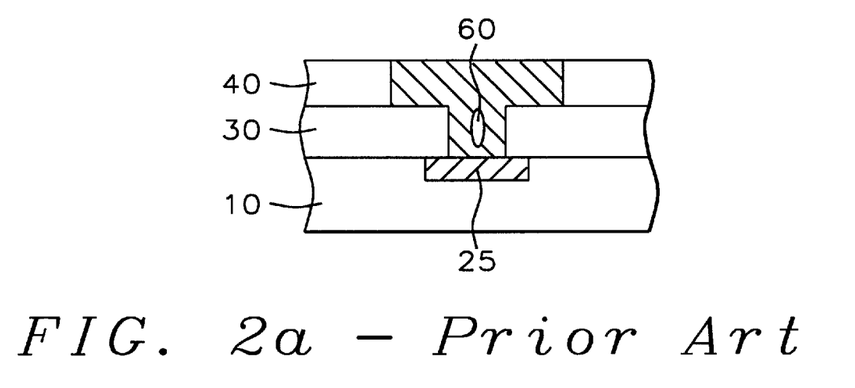
FIGS. 2a–2b show the forming of voids and key-hole defects in the tungsten metal interconnect of prior art.

Dual damascene is an improvement over single damascene because it permits the filling of both the trenches and the vias with metal at the same time, thereby eliminating process steps. Although this conventional damascene offers advantages over other processes for forming interconnections, it has a number of shortcomings, such as forming and filling the vias. For example, the edges of via openings in the lower insulating layer, after the second etching, are poorly defined because of the two etchings. In addition, because of the manner of filling the vias with metal voids (FIG. 2a) or key holes (FIG. 2b) are formed within the voids, resulting in reliability and via resistance problems.

In conventional via filling, as in most applications when contact holes and vias are less than 1.5 micrometers ($\mu$m), sloped vias are necessary to ensure adequate coverage (sometimes referred to as step-coverage) of the opening, or the mouth, of the via, with metal. This is because, as it is known in the art, when physical vapor deposition is used to deposit metal over holes, straight sidewalls result in worse step-coverage by the metal than if the sidewalls are sloped. On the other hand, the competing ultra-scale integration (ULSI) integrated circuit technology is demanding that the holes be formed ever so closely together, thus forcing the sloped walls to be vertical and straight. Then, with vertical walls, the aspect ratio (depth over width) dependence of the step coverage into contact holes and vias become critical as feature size are scaled into the submicron regime. It is found, for example, that as the aspect ratio increases to 1.0 so that the hole depth equals the width, the metal coverage over the edges of the hole is less than 5%. (See, S. Wolf and R. N. Tauber, "Silicon Processing for the VLSI Era," vol. 2, Lattice Press, Sunset Beach, Calif., 1990, p. 241.)

Figure 2B:
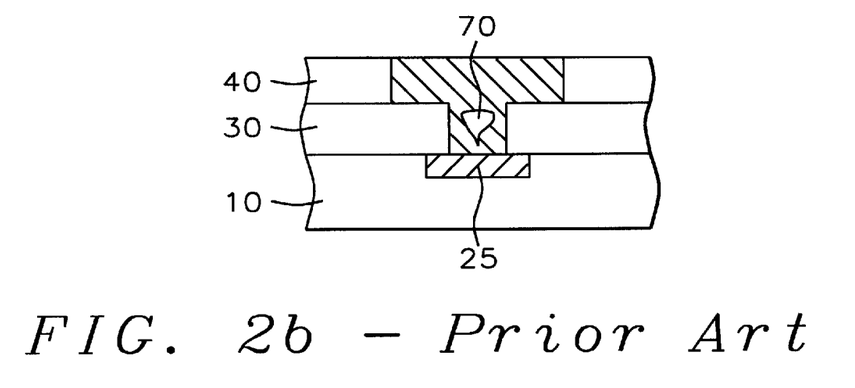

Among metals suitable for via and contact hole filling, tungsten, W, has been found to give the best conformal coverage of the topography of holes. There are generally two methods that have been developed for filling holes, and they are, blanket CVD W and etchback, and selective CVD W. Blanket chemical vapor deposition of tungsten is accomplished using silane reduction. However, as the deposition proceeds, the sidewalls of the vias are covered by the conformal CVD W film and they eventually become thick enough that they come into contact with one another. In the ideal case, the holes are thereby filled. In practice, however, keyholes, such as shown in FIG. 2b form. Furthermore, it is found that the density of the tungsten plug formed in the via hole is low. Similar problems also do occur with selective-W CVD as well.

Some of the problems cited above are addressed by workers in the field. Hwang, et al., in U.S. Pat. No. 5,661,080 disclose a method for fabricating a tungsten plug in a contact hole by depositing a tungsten film of a predetermined thickness several times to form a multilayer structure, thereby increasing the density of the tungsten plug. This is accomplished by forming a contact hole, forming a glue layer over the entire exposed surface of the resulting structure including the contact hole and the exposed surface of the insulating film, depositing a blanket tungsten films to a small thickness over the glue layer, depositing a seed layer to a small thickness over the blanket tungsten film, sequentially depositing another blanket tungsten film and another seed layer over the seed layer and repeating the sequential deposition. In another U.S. Pat. No. 5,462,890 by Hwang, et al., a similar method of making a tungsten plug is shown without the key-holes.

A dual damascene structure is described by Chang, et al., in an article in "ULSI Technology" published by the McGraw-Hill Company, Inc., 1997, pp.444–445. A self-aligned via dual damascene process is also described by Avanzino in U.S. Pat. No. 5,614,765, while method of making dual damascene antifuse structure is disclosed in U.S. Pat. No. 5,602,053.

However, the present invention is different from prior art in that a seeded selective W CVD is disclosed which restores full integrity to tungsten plugs as described fully in the embodiments of the instant invention.

SUMMARY OF THE INVENTION

It is therefore an object of this invention to provide a dual damascene process for forming composite structures for local interconnects comprising line trenches with contact holes, and composite structures for intermetal interconnects comprising line trenches with via holes using selective tungsten chemical vapor deposition.

It is another object of the present invention to provide a method of forming dual damascene structure without keyholes or voids.

It is still another object of the present invention to provide a method of utilizing a seed layer to form void-free vias in a dual damascene structure.

These objects are accomplished by providing a semiconductor substrate having active and passive regions; forming an interlevel dielectric (ILD) layer over said substrate having active and passive regions; forming an etch-stop layer over said ILD layer; forming an intermetal dielectric (IMD) layer over said etch-stop layer; forming a first photoresist layer over said IMD layer and patterning said photoresist layer with a mask comprising a line trench pattern; etching through said line trench pattern in said first photoresist layer to form said line trench pattern into said IMD layer, wherein said line trench has a sidewall and a flat bottom; removing said first photoresist layer; forming a seed layer over said IMD layer including said line trench with said sidewall and said flat bottom; removing said seed layer from the surface of said IMD layer including said flat bottom of said line trench; forming a second photoresist layer over said IMD layer and said line trench having sidewalls covered with said seed layer; patterning said second photoresist layer with a mask comprising a contact hole pattern; etching through said contact hole pattern in said second photoresist layer to form said contact hole pattern into said interlevel dielectric (ILD) layer; removing said second photoresist layer; cleaning said contact hole; depositing selective W CVD in said line trench and said contact hole composite structure; and performing chemical mechanical polish to planarize said substrate for subsequent process steps to complete the fabrication of a semiconductor substrate.

These objects are accomplished further by providing a semiconductor substrate having active and passive regions, wherein said active regions are interconnected in an interlevel conductive layer formed in an interlevel dielectric (ILD) layer readied for subsequent metal interconnects; forming a first intermetal dielectric (IMD) layer over said ILD having said interlevel conductive layer; forming a etch-stop layer over said first IMD layer; forming a second IMD layer over said etch-stop layer; forming a first photoresist layer over said second IMD layer and patterning said photoresist layer with a mask comprising a line trench pattern; etching through said line trench pattern in said first photoresist layer to form said line trench pattern into said second IMD layer, wherein said line trench has a sidewall and a flat bottom exposing said first IMD layer; removing said first photoresist layer; forming a seed layer covering said second IMD layer including said line trench with said sidewall and said flat bottom; removing said seed layer from the surface of said second IMD layer including said flat bottom of said line trench; forming a second photoresist layer over said second IMD layer and said line trench having sidewalls covered with said seed layer; patterning said second photoresist layer with a mask comprising a via hole pattern; etching through said via hole pattern in said second photoresist layer to form said via hole pattern into said first IMD layer; removing said second photoresist layer; cleaning said via hole; depositing selective W CVD in said line trench and said contact hole composite structure; and performing chemical mechanical polish to planarize said substrate for subsequent process steps to complete the fabrication of a semiconductor substrate.

DESCRIPTION OF THE PREFERRED EMBODIMENTS

Referring now the drawings, in particular to FIGS. 3a–3f and FIGS. 4a–4f, there is shown a dual damascene process using selective tungsten chemical vapor deposition for forming composite structures for local interconnects comprising line trenches with contact holes, and composite structures for intermetal interconnects comprising line trenches with via holes.

Figure 3A:
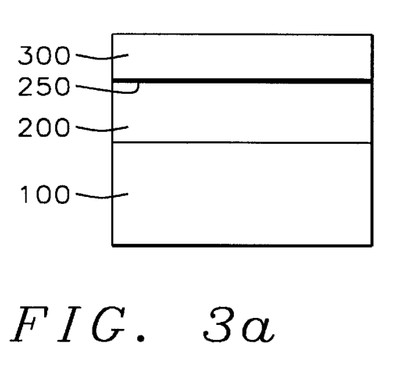
FIG. 3a shows the forming of interlevel dielectric (ILD) layer and intermetal dielectric (IMD) layer separated by an intervening etch-stop layer on a semiconductor substrate according to this invention.

FIG. 3a shows a portion of a semiconductor substrate (100), preferably silicon, with a substructure of devices formed in the substrate thereof, and as they are not significant to the invention, they are not described in detail in order not to unnecessarily obscure the present invention. It is important to note, however, that the dual damascene process practiced conventionally is usually applied to forming interconnects through via holes between metal layers. The method disclosed here is applicable to both local interconnects comprising contact holes and to intermetal interconnects comprising via holes.

An interlevel dielectric (ILD) layer, (200), is formed on substrate (100) of FIG. 3a. As is well known in the art, blanket dielectric layers may be formed from materials including but not limited to silicon oxide materials, silicon nitride materials, and silicon oxynitrides materials formed within integrated circuits through methods including but not limited do CVD, PECVD, PVD sputtering methods. For the preferred embodiment of the present invention, the blanket ILD layer is preferably formed of silicon oxide having a thickness between about 500 to 600 angstroms (Å). An etch-stop layer (250), preferably silicon nitride, is next formed over ILD layer (200) with a thickness between about 300 to 400 Å. The etch-stop layer will serve to stop etching when next layer is etched to form line trenches, as described below.

The next layer of dielectric, (300), shown in FIG. 3a is the intermetal dielectric (IMD) layer that is formed above the ILD layer and below the first metal layer that will be formed subsequently. IMD layer has a thickness between about 3000 to 7000 Å, and can be a phosphosilicate glass (PSG), or, preferably, an oxide formed by the decomposition of tetraethyl orthosilicate (TEOS) at a temperature between about 350 to 450° C. using plasma enhanced chemical vapor deposition (PECVD).

Figure 3B:
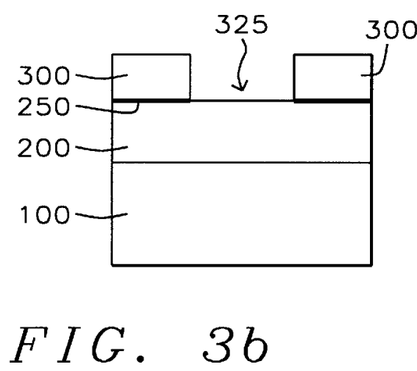
FIG. 3b shows the forming of a line trench in the ILD layer of FIG. 3a, according to this invention.

A first layer of photoresist (not shown) is formed over IMD layer (300) at a thickness between about 1.0 to 1.2 micrometers (μm) and then patterned with a mask having images of a line trench. Line trench (325) shown in FIG. 3b is formed by etching the line trench pattern in the first photoresist layer into IMD layer (300) until etch-stop layer (250) is reached. The etching is accomplished preferably with a recipe comprising gases $O_2$ with a flow rate between about 10 to 250 sccm, He between about 40 to 80 sccm, $SO_2$ between about 10 to 80 sccm, and $CF_4$ between about 0–50 sccm. The etchant is next modified to a recipe comprising gases $O_2$, $SO_2$, $CF_4$ and He at flow rates between about 10 to 250, 10 to 80, 0 to 50 sccm and 40 to 80 sccm, respectively so that the etch-stop, silicon nitride layer (250), can be removed from the bottom of trench (325) as shown in FIG. 3b. After the removal of the portion of etch-stop layer at the bottom of trench (325), first photoresist layer is removed.

Figure 3C:
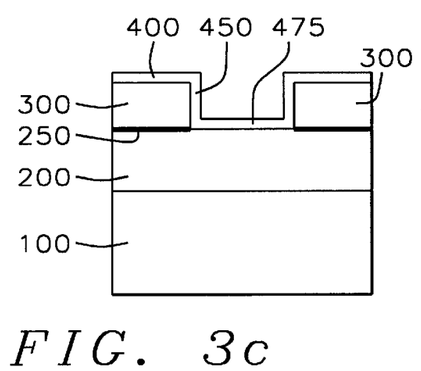
FIG. 3c shows the forming of a seed layer on the substrate of FIG. 3b, according to this invention.

As a main feature and key aspect of the present invention, the next step introduces a seed layer which is deposited covering the surface of the sub substrate and the interior walls of the trench as shown in FIG. 3c. Seed layer (400) covers the sidewall (450) and bottom (475) of line trench (325). The seed layer, which is tungsten of a thickness between about 800 to 900 Å, is formed using $WF_6$ and $H_2$ gases in combination with silane $SiH_4$ at a flow rate between about 10 to 110 sccm, and, preferably, at a temperature between about 300 to 325° C. The seed layer can also be titanium/titanium nitride (Ti/TiN) "glue" layer of a thickness between about 200 to 1000 angstroms (Å), and deposited by physical vapor deposition (PVD) or chemical vapor deposition (CVD).

Figure 3D:
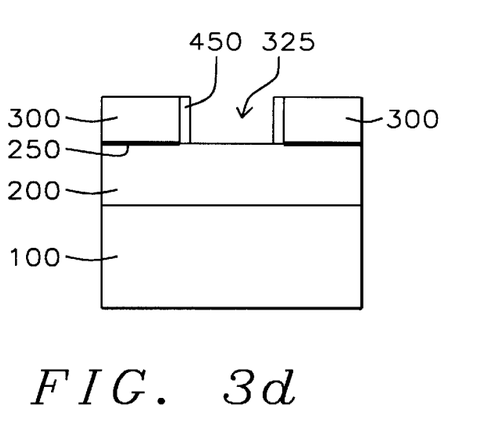
FIG. 3d shows the removal of the seed layer of FIG. 3c except from the sidewalls of the line trench, according to this invention.

Next, seed layer (400) is removed from everywhere excepting the sidewalls (450) of trench (325) as shown in FIG. 3d. This is accomplished by using anisotropic reactive ion etch with a gas mixture of $SF_6$, Hbr, and $CCl_4$ or by chemical-mechanical polishing (CMP). It is critical that the integrity of the seed layer on the sidewalls is acceptable, that is, without cracks and other defects. This is because, voids and worm-holes that normally encroach from the sidewalls into the trench when tungsten is next deposited into the trench are eliminated by the presence of a robust seed layer (450) on the sidewalls.

Figure 3E:
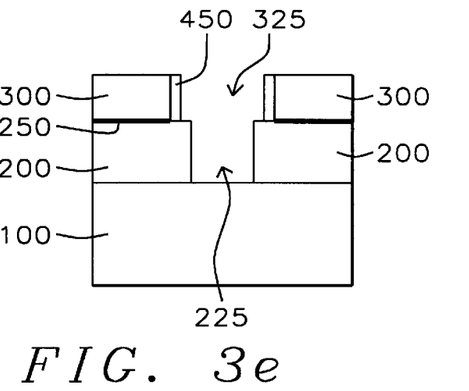
FIG. 3e shows the forming of a contact hole in the substrate of FIG. 3d, according to this invention.

With the seed layer, (450), in place on the sidewalls of trench (325), a second layer of photoresist (not shown) is formed over IMD layer (300) at a thickness between about 0.8 to 1.0 μm and then patterned with a mask having images of a contact hole. Contact hole (225) shown in FIG. 3e is formed by etching the contact hole pattern in the second photoresist layer into IMD layer (300) until the surface of the silicon substrate, (100), is reached. The etching through the contact hole pattern in the second photoresist layer into the ILD layer is accomplished with a recipe comprising gases Ar, $CHF_3$ and $C_4F_8$ at a flow rate between about 50 to 150 sccm, 10 to 50 sccm, and 0 to 22 sccm, respectively. After the etching of contact hole (225), the hole is sputter etched so as to clean the silicon surface of the semiconductor substrate (100) exposed at the bottom of the hole.

It will be observed in FIG. 3e, that the composite structure comprising line trench (325) and contact hole (225) together form the damascene structure of this invention where the side-walls of the line trench are covered with the disclosed seed layer. Tungsten is next selectively deposited into this new damascene structure using chemical vapor deposition to complete the disclosed tungsten interconnect without voids or key-holes. The selective W CVD is accomplished with a silane reduction process given by the reaction at a relatively low temperature between about 275 to 325° C.

Figure 3F:
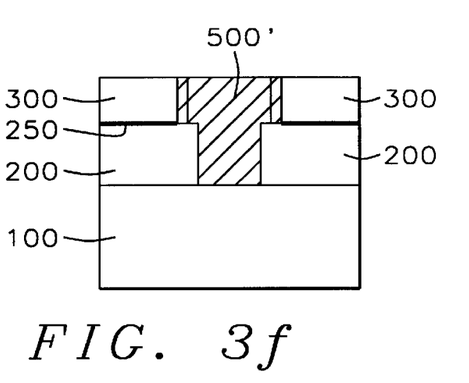
FIG. 3f shows the forming of a dual damascene structure of this invention by selective W CVD deposition into the line trench and contact hole composite structure of this invention.

Finally, chemical mechanical polishing is performed (not shown) in order to planarize the metal/IMD surface for subsequent process steps to complete the fabrication of the semiconductor substrate. The resulting structure is shown in FIG. 3f.

The method disclosed above for forming dual damascene structures comprising line trenches and contact holes, is also applicable for structures comprising line trenches and via holes interconnecting personalized metal layers.

Figure 4A:
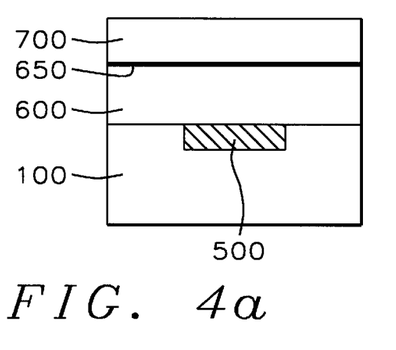
FIG. 4a shows the forming of a first intermetal dielectric (IMD) layer and a second (IMD) layer separated by an intervening etch-stop layer on a semiconductor substrate according to this invention.

Thus, FIG. 4a shows a portion of a semiconductor substrate (100), preferably silicon, provided with a substructure of devices formed in the substrate and/or metal layers thereof, and as they are not significant to the invention, they are not described in detail in order not to unnecessarily obscure the present invention. Metal layer (500) in FIG. 4a represents a lower metal interconnect layer which is to be interconnected to an upper metal layer to be formed. A first intermetal dielectric (IMD) layer, (600), is formed on substrate (100) of FIG. 4a. As is well known in the art, blanket dielectric layers may be formed from materials including but not limited to silicon oxide materials, silicon nitride materials, and silicon oxynitrides materials formed within integrated circuits through methods including but not limited do CVD, PECVD, PVD sputtering methods. For the preferred embodiment of the present invention, the blanket first IMD layer has a thickness between about 3000 to 7000 Å, and can be a phosphosilicate glass (PSG), or, preferably, an oxide formed by the decomposition of tetraethyl orthosilicate (TEOS) at a temperature between about 350 to 450° C. using plasma enhanced chemical vapor deposition (PECVD). An etch-stop layer (650), preferably silicon nitride, is next formed over first IMD layer (600) with a thickness between about 300 to 400 Å. The etch-stop layer will serve to stop etching when next layer is etched to form line trenches, as described below.

The next layer of dielectric, (700), shown in FIG. 4a is second intermetal dielectric (IMD) layer that is formed above the first IMD layer and below the first metal layer that will be formed subsequently. The second IMD layer has a thickness between about 5000 to 7000 Å, and can be a phosphosilicate glass (PSG), or, preferably, an oxide formed by the decomposition of tetraethyl orthosilicate (TEOS) at a temperature between about 350 to 450° C. using plasma enhanced chemical vapor deposition (PECVD).

Figure 4B:
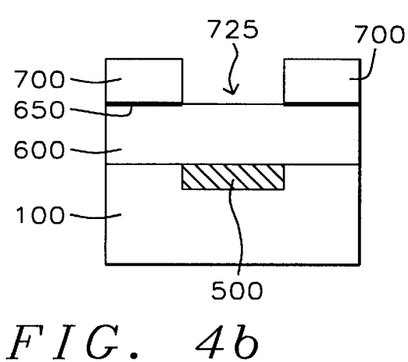
FIG. 4b shows the forming of a line trench in the first IMD layer of FIG. 4a, according to this invention.

A first layer of photoresist (not shown) is formed over second IMD layer (700) at a thickness between about 1.0 to 1.2 micrometers ($\mu$m) and then patterned with a mask having images of a line trench. Line trench (725) shown in FIG. 4b is formed by etching the line trench pattern in the first photoresist layer into second IMD layer (700) until etch-stop layer (650) is reached. The etching is accomplished preferably with a recipe comprising gases $O_2$ with a flow rate between about 10 to 250 sccm, He between about 40 to 80 sccm, $SO_2$ between about 10 to 80 sccm, and $CF_4$ between about 0–50 sccm. The etchant is next modified to a recipe comprising gases $O_2$, $SO_2$, $CF_4$ and He at flow rates between about 10 to 250, 10 to 80, 0 to 50 sccm and 40 to 80 sccm, respectively so that the etch-stop, silicon nitride layer (650), can be removed from the bottom of trench (725) as shown in FIG. 4b. After the removal of the portion of etch-stop layer at the bottom of trench (725), first photoresist layer is removed.

Figure 4C:
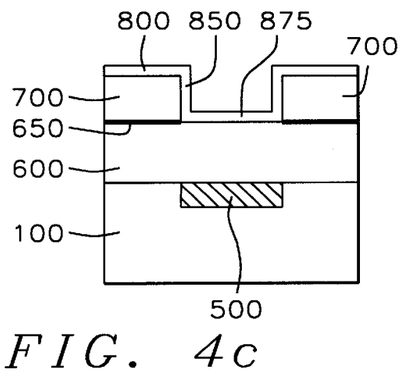
FIG. 4c shows the forming of a seed layer on the substrate of FIG. 4b, according to this invention.

As a main feature and key aspect of the present invention, the next step introduces a seed layer which is deposited covering the surface of the sub substrate and the interior walls of the trench as shown in FIG. 4c. Seed layer (800) covers the sidewall (850) and bottom (875) of line trench (725). The seed layer, which is tungsten metal of a thickness between about 800 to 900 Å, is formed using $WF_6$ and $H_2$ gases in combination with silane $SiH_4$ at a flow rate between about 10 to 110 sccm, and, preferably, at a temperature between about 300 to 325° C. The seed layer can also be Ti/TiN glue layer of a thickness between about 200 to 1000 Å, and deposited by physical vapor deposition (PVD) or chemical vapor deposition (CVD).

Figure 4D:
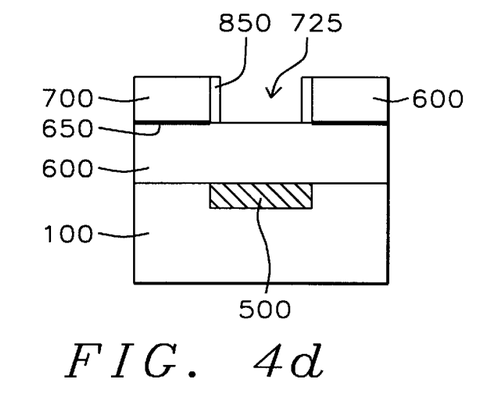
FIG. 4d shows the removal of the seed layer of FIG. 4c except from the sidewalls of the line trench, according to this invention.

Next, seed layer (400) is removed from everywhere excepting the sidewalls (850) of trench (725) as shown in FIG. 4d. This is accomplished by using anisotropic reactive ion etch with a gas mixture of $SF_6$, Hbr, and $CCl_4$ or by CMP. It is critical that the integrity of the seed layer on the sidewalls is acceptable, that is, without cracks and other defects. This is because, voids and worm-holes that normally encroach from the sidewalls into the trench when tungsten is next deposited into the trench are eliminated by the presence of a robust seed layer (850) on the sidewalls.

Figure 4E:
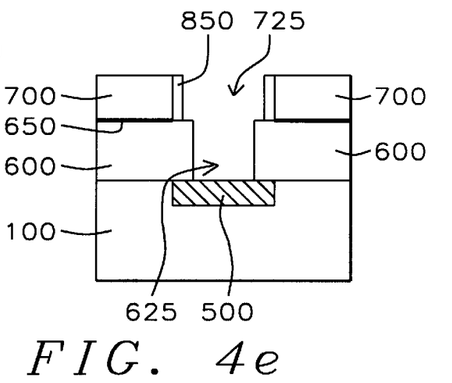
FIG. 4e shows the forming of a via hole in the first IMD layer of FIG. 4d, according to this invention.

With the seed layer, (850), in place on the sidewalls of trench (725), a second layer of photoresist (not shown) is formed over second IMD layer (700) at a thickness between about 0.8 to 1.0 $\mu$m and then patterned with a mask having images of a via hole. Via hole (625) shown in FIG. 4e is formed by etching the via hole pattern in the second photoresist layer into first IMD layer (700) until the lower metal layer (500) is reached. The etching through the via hole pattern in the second photoresist layer into the first IMD layer is accomplished with a recipe comprising gases Ar, $CHF_3$ and $C_4F_8$ at a flow rate between about 50 to 150 sccm, 10 to 50 sccm, and 0 to 22 sccm, respectively. After the etching of via hole (625), the hole is sputter etched so as to clean the metal surface, (500), exposed at the bottom of the hole.

It will be observed in FIG. 4e, that the composite structure comprising line trench (725) and via hole (625) together form the damascene structure of this invention where the side-walls of the line trench are covered with the disclosed seed layer. Tungsten is next selectively deposited into this new damascene structure using chemical vapor deposition to complete the disclosed tungsten interconnect without voids or key-holes. The selective W CVD is accomplished with a silane reduction process given by the reaction $$WF_6 + 3SiH_4 \rightarrow 2W + 3SiF_4 + 6H_2$$

at a relatively low temperature between about 275 to 325° C.

Figure 4F:
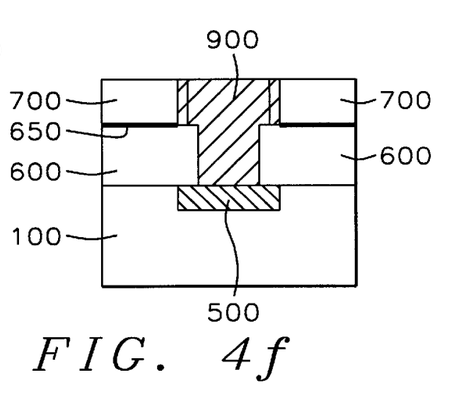
FIG. 4f shows the forming of a dual damascene structure of this invention by selective W CVD deposition into the line trench and via hole composite structure of this invention.

Finally, chemical mechanical polishing is performed (not shown) in order to planarize the metal/second IMD surface for subsequent process steps to complete the fabrication of the semiconductor substrate. The resulting structure is shown in FIG. 4f.

Though numerous details of the disclosed device are set forth here, such as dimensions and materials, to provide an understanding of the present invention, it will be obvious, however, to those skilled in the art that these specific details need not be employed to practice the present invention. At the same time, it will be evident that the same or similar devices may be employed for other applications such as for foot operated machines.

That is, while the invention has been particularly shown and described with reference to the preferred embodiments thereof, it will be understood by those skilled in the art that various changes in form and details may be made without departing from the spirit and scope of the invention.

What is claimed is:

1. A method of forming a dual damascene structure using selective tungsten chemical vapor deposition comprising the steps of:

providing a semiconductor substrate having active and passive regions;

forming an interlevel dielectric (ILD) layer over said substrate having active and passive regions;

forming an etch-stop layer over said ILD layer;

forming an intermetal dielectric (IMD) layer over said etch-stop layer;

forming a first photoresist layer over said IMD layer and patterning said photoresist layer with a mask comprising a line trench pattern;

etching through said line trench pattern in said first photoresist layer to form said line trench pattern into said IMD layer, wherein said line trench has a sidewall and a flat bottom;

removing said first photoresist layer;

forming a seed layer over said IMD layer including said line trench with said sidewall and said flat bottom;

removing said seed layer from the surface of said IMD layer including said flat bottom of said line trench;

forming a second photoresist layer over said IMD layer and said line trench having sidewalls covered with said seed layer;

patterning said second photoresist layer with a mask comprising a contact hole pattern;

etching through said contact hole pattern in said second photoresist layer to form said contact hole pattern into said interlevel dielectric (ILD) layer;

removing said second photoresist layer;

cleaning said contact hole;

depositing selective W CVD in said line trench and said contact hole composite structure; and performing chemical mechanical polish to planarize said substrate for subsequent process steps to complete the fabrication of a semiconductor substrate.

2. The method of claim 1, wherein said interlevel dielectric (ILD) layer is silicon oxide having a thickness between about 500 to 600 angstroms (Å).

3. The method of claim 1, wherein said etch-stop is silicon nitride having a thickness between about 300 to 400 Å.

4. The method of claim 1, wherein said IMD is phosphosilicate glass (PSG), or TEOS oxide, having a thickness between about 3000 to 7000 Å.

5. The method of claim 1, wherein said first photoresist layer has a thickness between about 1.0 to 1.2 micrometers ($\mu$m).

6. The method of claim 1, wherein said etching through said line trench pattern in said first photoresist layer into said IMD layer is accomplished with a mixture comprising gases $O_2$ with a flow rate between about 10 to 250 sccm, He between about 40 to 80 sccm, $SO_2$ between about 10 to 80 sccm, and $CF_4$ between about 0–50 sccm.

7. The method of claim 6, wherein said etching through said line trench pattern in said first photoresist layer into said IMD layer is accomplished until said etch-stop layer is reached.

8. The method of claim 7, wherein said etch-stop is removed by etching with a mixture comprising gases $O_2$, $SO_2$, $CF_4$ and He at flow rates between about 10 to 250, 10 to 80, 0 to 50 sccm and 40 to 80 sccm, respectively.

9. The method of claim 1, wherein said forming of a seed layer, having a thickness between about 800 to 900 Å, is accomplished using $WF_6$ and $H_2$ gases in combination with $SiH_4$ at a flow rate between about 10 to 110 sccm, and at a temperature between about 300 to 350° C., or by forming a Ti/TiN glue layer of a thickness between about 200 to 1000 (Å) and deposited by PVD or CVD.

10. The method of claim 1, wherein said removing said seed layer is accomplished with an etch mixture comprising gases $SF_6$, HBr, and $CCl_4$.

11. The method of claim 1, wherein said second photoresist layer has a thickness between about 0.8 to 1.0 micrometers ($\mu$m).

12. The method of claim 1, wherein said etching through said contact hole pattern in said second photoresist layer into said ILD layer is accomplished with a mixture comprising gases Ar, $CHF_3$ and $C_4F_8$ at a flow rate between about 50 to 150 sccm, 10 to 50 sccm, and 0 to 22 sccm, respectively.

13. The method of claim 12, wherein said etching through said contact hole pattern in said second photoresist layer into said ILD layer is accomplished until surface of said silicon substrate is reached.

14. The method of claim 1, wherein said cleaning is accomplished with reactive ion etch (RIE).

15. The method of claim 1, wherein said forming metal in said line trench and said contact hole composite structure is accomplished with selective tungsten chemical vapor deposition (selective W CVD).

16. The method of claim 15, wherein said selective W CVD is accomplished with silane reduction process at a temperature between about 275 to 325° C.

17. A method of forming a dual damascene structure using selective tungsten chemical vapor deposition comprising the steps of:

providing a semiconductor substrate having active and passive regions, wherein said active regions are interconnected in an interlevel conductive layer formed in an interlevel dielectric (ILD) layer readied for subsequent metal interconnects;

forming a first intermetal dielectric (IMD) layer over said ILD having said interlevel conductive layer;

forming a etch-stop layer over said first IMD layer;

forming a second IMD layer over said etch-stop layer;

forming a first photoresist layer over said second IMD layer and patterning said photoresist layer with a mask comprising a line trench pattern;

etching through said line trench pattern in said first photoresist layer to form said line trench pattern into said second IMD layer, wherein said line trench has a sidewall and a flat bottom exposing said first IMD layer;

removing said first photoresist layer;

forming a seed layer covering said second IMD layer including said line trench with said sidewall and said flat bottom;

removing said seed layer from the surface of said second IMD layer including said flat bottom of said line trench;

forming a second photoresist layer over said second IMD layer and said line trench having sidewalls covered with said seed layer;

patterning said second photoresist layer with a mask comprising a via hole pattern;

etching through said via hole pattern in said second photoresist layer to form said via hole pattern into said first IMD layer;

removing said second photoresist layer;

cleaning said via hole;

depositing selective W CVD in said line trench and said via hole composite structure; and performing chemical mechanical polish to planarize said substrate surface for subsequent process steps to complete the fabrication of a semiconductor substrate.

18. The method of claim 17, wherein said interlevel dielectric (ILD) layer is silicon oxide having a thickness between about 500 to 600 angstroms (Å).

19. The method of claim 17, wherein said first IMD layer is phosphosilicate glass (PSG), or TEOS oxide, having a thickness between about 3000 to 7000 Å.

20. The method of claim 17, wherein said etch-stop is silicon nitride having a thickness between about 300 to 400 Å.

21. The method of claim 17, wherein said second IMD layer is phosphosilicate glass (PSG), or TEOS oxide, having a thickness between about 5000 to 7000 Å.

22. The method of claim 17, wherein said first photoresist layer over said second IMD layer has a thickness between about 1.0 to 1.2 micrometers ($\mu$m).

23. The method of claim 17, wherein said etching through said line trench pattern in said first photoresist layer into said second IMD layer is accomplished with a mixture comprising gases $O_2$ with a flow rate between about 10 to 250 sccm, He between about 40 to 80 sccm, $SO_2$ between about 10 to 80 sccm, and $CF_4$ between about 0–50 sccm.

24. The method of claim 22, wherein said etching through said line trench pattern in said first photoresist layer into said second IMD layer is accomplished until said etch-stop layer is reached.

25. The method of claim 24, wherein said etch-stop is removed by etching with a recipe comprising gases $O_2$, $SO_2$, $CF_4$ and He at flow rates between about 10 to 250, 10 to 80, 0 to 50 sccm and 40 to 80 sccm, respectively.

26. The method of claim 17, wherein said forming of a seed layer is accomplished using $WF_6$ and $H_2$ gases in combination with $SiH_4$ at a flow rate between about 10 to 110 sccm, or by forming a Ti/TiN glue layer of a thickness between about 200 to 1000 (Å) and deposited by PVD or CVD.

27. The method of claim 17, wherein said removing said seed layer is accomplished with an etch mixture comprising gases $SF_6$, HBr, and $CCl_4$.

28. The method of claim 17, wherein said second photoresist layer has a thickness between about 0.8 to 1.0 micrometers ($\mu$m).

29. The method of claim 17, wherein said etching through said via hole pattern in said second photoresist layer into said first IMD layer is accomplished with a mixture comprising gases Ar, $CHF_3$ and $C_4F_8$ at a flow rate between about 50 to 150 sccm, 10 to 50 sccm, and 0 to 22 sccm, respectively.

30. The method of claim 29, wherein said etching through said via hole pattern in said second photoresist layer into said first IMD layer is accomplished until lower metal layer is reached.

31. The method of claim 17, wherein said cleaning is accomplished with reactive ion etch (RIE).

32. The method of claim 17, wherein said forming metal in said line trench and said via hole composite structure is accomplished with selective tungsten chemical vapor deposition (selective W CVD).

33. The method of claim 32, wherein said selective W CVD is accomplished with silane reduction process at a temperature between about 275 to 325° C.

* * * * *